(12) United States Patent
Oda et al.

(10) Patent No.: US 10,202,685 B2
(45) Date of Patent: Feb. 12, 2019

(54) METHOD OF MANUFACTURING OXIDE CRYSTAL THIN FILM

(71) Applicant: FLOSFIA INC., Kyoto-shi (JP)

(72) Inventors: Masaya Oda, Kyoto (JP); Toshimi Hitora, Kyoto (JP)

(73) Assignee: FLOSFIA INC., Kyoto-shi (JP)

( * ) Notice: Subject to any disclaimer, the term of this patent is extended or adjusted under 35 U.S.C. 154(b) by 0 days.

(21) Appl. No.: 14/233,568

(22) PCT Filed: Nov. 11, 2013

(86) PCT No.: PCT/JP2013/080451
§ 371 (c)(1),
(2) Date: Jan. 17, 2014

(87) PCT Pub. No.: WO2014/196095
PCT Pub. Date: Dec. 11, 2014

(65) Prior Publication Data
US 2015/0225843 A1    Aug. 13, 2015

(30) Foreign Application Priority Data
Jun. 4, 2013    (JP) ................................. 2013-118358

(51) Int. Cl.
*C23C 16/06*     (2006.01)
*C30B 7/14*     (2006.01)
(Continued)

(52) U.S. Cl.
CPC .............. *C23C 16/06* (2013.01); *C23C 16/20* (2013.01); *C23C 16/40* (2013.01); *C23C 16/44* (2013.01);
(Continued)

(58) Field of Classification Search
CPC .......... C23C 16/06; C23C 16/20; C23C 16/44
(Continued)

(56) References Cited

U.S. PATENT DOCUMENTS 4,569,881 A * 2/1986 Freese et al. .................. 428/213
4,876,117 A * 10/1989 Bornstein ...................... 427/130
(Continued)

FOREIGN PATENT DOCUMENTS

JP    1-189815 A    7/1989
JP    2003-64475 A    3/2003
(Continued)

OTHER PUBLICATIONS

Karazhanov—"Phase stability, electronic structure, and optical structure of indium oxide polytypes", S. Zh. Karazhanov et al, Physical Review B 76, 075129, 2007.*
(Continued)

*Primary Examiner* — Michael P Wieczorek
*Assistant Examiner* — Michael G Miller
(74) *Attorney, Agent, or Firm* — Christensen O'Connor Johnson Kindness PLLC

(57) ABSTRACT

There is provided a thin film manufacturing method which allows both a reduction in the carbon impurity concentration and a high film forming speed, as well as allows separate formation of stable crystal structures. There is provided a method for manufacturing an oxide crystal thin film. The method includes carrying raw material fine particles to a film forming chamber by means of a carrier gas, the raw material fine particles being formed from a raw material solution including water and at least one of a gallium compound and an indium compound, and forming an oxide crystal thin film on a sample on which films are to be formed, the sample being placed in the film forming chamber. At least one of the gallium compound and the indium compound is bromide or iodide.

5 Claims, 1 Drawing Sheet

(51) Int. Cl.

| | |
|---|---|
| *C30B 25/14* | (2006.01) |
| *C23C 16/40* | (2006.01) |
| *C30B 29/16* | (2006.01) |
| *H01L 21/02* | (2006.01) |
| *C23C 16/20* | (2006.01) |
| *C23C 16/44* | (2006.01) |
| *C23C 16/448* | (2006.01) |

(52) U.S. Cl.
CPC ............ *C23C 16/4482* (2013.01); *C30B 7/14* (2013.01); *C30B 25/14* (2013.01); *C30B 29/16* (2013.01); *H01L 21/0262* (2013.01); *H01L 21/02565* (2013.01); *H01L 21/02601* (2013.01); *H01L 21/02628* (2013.01)

(58) Field of Classification Search
USPC ............................................ 427/248.1–255.7
See application file for complete search history.

(56) References Cited

U.S. PATENT DOCUMENTS

| 5,180,686 A * | 1/1993 | Banerjee et al. ............... 438/62 |
| 5,882,368 A * | 3/1999 | Falcony-Guajardo et al. ............. 65/60.1 |
| 6,533,966 B1 | 3/2003 | Nonninger |
| 6,633,735 B2 | 10/2003 | Kellie |
| 7,147,805 B2 * | 12/2006 | Miyoshi ..................... 252/520.1 |
| 8,742,414 B2 * | 6/2014 | Kim ................. H01L 21/02554 252/521.6 |
| 2006/0163563 A1 * | 7/2006 | Ulmer et al. ................... 257/40 |
| 2007/0184576 A1 | 8/2007 | Chang |
| 2008/0254231 A1 * | 10/2008 | Lin et al. ..................... 427/576 |

FOREIGN PATENT DOCUMENTS

| JP | 2003-253450 A | 9/2003 |
| JP | 2005-353505 A | 12/2005 |
| JP | 2010-215982 A | 9/2010 |
| JP | 2011-210422 A | 10/2011 |
| JP | 2012-71301 A | 4/2012 |
| JP | 2013-028480 A | 2/2013 |
| JP | 2013-180942 A | 9/2013 |
| JP | 2014-131020 A | 7/2014 |
| KR | 2001-0074957 A | 8/2001 |
| KR | 10-0421018 B1 | 3/2004 |
| TW | 201041153 A | 11/2010 |
| TW | 201243869 A | 11/2012 |

OTHER PUBLICATIONS

UBC website—http://www.eos.ubc.ca/courses/Dist-Ed/eosc118-webpromo/01-modB-les17-webpromo.html, accessed online Aug. 6, 2015.*

Kim ("Optical properties of beta-Ga2O3 and alpha-Ga2O3:Co thin films grown by spray pyrolysis", Hyung-Gon Kim and Wha-Tek Kim, J. Appl. Phys 62 (5), Sep. 1, 1987, pp. 2000-2002).*

Taiwan Office Action, dated Dec. 11, 2014, issued in Taiwan Patent Application No. 103 102 617, filed Jan. 24, 2014, 6 pages.

Furuta, M., et al., "Electrical Properties of the Thin-Film Transistor With an Indium-Gallium-Zinc Oxide Channel and Aluminium Oxide Gate Dielectric Stack Formed by Solution-Based Atmospheric Pressure Deposition," IEEE Electron Device Letters 33(6):851-853, Jun. 2012.

Korean Office Action dated Mar. 17, 2015, issued in corresponding Korean Application No. 10-2014-7002068, filed Jan. 24, 2014, 10 pages.

Extended European Search Report dated Aug. 11, 2015, issued in corresponding International Application No. PCT/JP2013/080451, filed Nov. 11, 2013, 4 pages.

Japanese Office Action dated Mar. 14, 2017, issued in corresponding Japanese Application No. 2013-212620, filed Oct. 10, 2013, 10 pages.

* cited by examiner

METHOD OF MANUFACTURING OXIDE CRYSTAL THIN FILM

TECHNICAL FIELD

The present invention relates to a method for manufacturing an oxide crystal thin film.

BACKGROUND ART

Known methods for forming a gallium oxide thin film having high crystallinity on a sample on which films are to be formed include a method of forming a film using water fine particles, such as the mist CVD method (Patent Document 1). For example, this method is used as follows: a gallium compound such as gallium acetylacetonate is dissolved in an acid such as hydrochloric acid to form a raw material aqueous solution; the raw material aqueous solution is converted into raw material fine particles; the raw material fine particles are carried by a carrier gas to the film forming surface of a sample on which films are to be formed; and the raw material mist is caused to react to form a thin film on the film forming surface. Thus, a gallium oxide thin film having high crystallinity is formed on the sample.

The method described in Patent Document 1 also allows formation of a gallium oxide thin film having high crystallinity. However, when forming a gallium oxide thin film using the method of Patent Document 1, the inventors found that the thin film included unintended carbon impurities. Such carbon impurities also serve as a dopant. Accordingly, the existence of the unintended carbon impurities makes it difficult to control the doping concentration.

Further, an acetylacetonate complex has poor solubility in water. Even when an acidic solution is used, it is difficult to increase the concentration of the raw material solution. Accordingly, when forming a film at high speed, the concentration of the raw material cannot be increased. Further, water-based CVD methods, typified by the mist CVD method, are said to have lower raw material efficiency than other CVD methods and to have increases in the raw material efficiency as a challenge for commercialization.

On the other hand, Non-Patent Document 1 attempted to form a film from gallium chloride. Since gallium chloride is free of carbon and has good solubility in water, the inventors expected that use of gallium chloride would solve the above problems. Unfortunately, the inventors could form no film from gallium chloride and thus concluded that acetylacetonate and water were essential to form a film.

PRIOR ART DOCUMENTS

Patent Documents

[Patent Document 1] Japanese Unexamined Patent Application Publication No. 2013-28480.

Non-Patent Documents

[Non-Patent Document 1] Daisuke Shinohara, "Formation of α-phase Gallium Oxide Monocrystal Thin Film on Sapphire Substrate Using Ultrasonic Spray CVD Method and Deep Ultraviolet Optical Functions Thereof," master's thesis to Kyoto University, Feb. 1, 2008.

SUMMARY OF THE INVENTION

Problems to be Solved by the Invention

Known materials having good solubility include chloride, as well as various types of materials, such as bromide, iodide, nitrate, and sulfate. Typically, these materials are used as raw materials when synthesizing various types of oxide using the solid phase method, the solution method, or the like. However, it has been believed that it is disadvantageously impossible to form a thin film from these materials, including gallium chloride, and in particular, from group 13 element oxides by means of a CVD reaction in which water contributes to a reaction, typified by mist CVD, or it has been believed that even when such a film is formed, the film forming speed is extremely slow. For these reasons, the prior technologies cannot achieve both a reduction in the carbon impurity concentration and a high film forming speed.

As described above, the method described in Patent Document 1 can form a gallium oxide thin film having high crystallinity. However, if gallium acetylacetonate and gallium chloride described in Patent Document 1 are used to grow a corundum-structured α-phase gallium oxide crystal, the ranges of the raw material concentration and the film forming temperature are strictly limited.

When a crystal material such as gallium oxide is used as an electronic device and in particular as a power device, it is preferred to use a monocrystal. In many cases, there is used a crystal which is not a perfect monocrystal but is oriented to a certain crystal axis. The reasons include the following: pure material properties can be used; physical properties are easily controlled; and there is no need to consider the effect of a grain boundary. However, since the most stable phase of gallium oxide is a β structure, a β-phase $Ga_2O_3$ crystal enters an α-phase $Ga_2O_3$ crystal when the raw material concentration or film forming temperature falls outside the limited range, and then grows there. For this reason, an α-phase crystal and a β-phase crystal must be formed separately. But, it has been difficult to grow an α-phase $Ga_2O_3$ crystal with good reproducibility without being subject to process variations.

On the other hand, the most stable phase of indium oxide is a bixbyite structure, and also has difficulty in obtaining a corundum-structured single phase. Accordingly, it is difficult to grow an α-phase $In_2O_3$ crystal with good reproducibility.

The present invention has been made in view of the foregoing and provides a thin film manufacturing method which allows both a reduction in the carbon impurity concentration and a high film forming speed, as well as allows separate formation of stable crystal structures.

Means for Solving the Problems

The present invention provides a method for manufacturing an oxide crystal thin film. The method includes carrying raw material fine particles to a film forming chamber by means of a carrier gas, the raw material fine particles being formed from a raw material solution including water and at least one of a gallium compound and an indium compound, and forming an oxide crystal thin film on a sample on which films are to be formed, the sample being placed in the film forming chamber. At least one of the gallium compound and the indium compound is bromide or iodide.

To achieve both a reduction in the carbon impurity concentration and a high film forming speed, the inventors formed films from various types of gallium compounds. As a result, the inventors found that when a film was formed from gallium bromide or gallium iodide, the carbon impurity concentration was significantly reduced and that the film forming speed was greatly increased compared to when gallium acetylacetonate was used.

The inventors also found that while aluminum bromide or aluminum iodide caused almost no thin film growth reaction, use of indium bromide or indium iodide allowed both a reduction in the carbon impurity concentration and a high film forming speed. Further, the inventors attempted to form films from bromide or iodide of Cr, Fe, Ti, Si, V, and Mg. However, any of these compounds caused no or almost no thin film growth reaction.

While the reason why when bromide or iodide of metals other than gallium and indium was used, the film forming speed was low remains unclear, the above results strongly suggests that the phenomenon in which the film forming speed was increased is specific to bromide or iodide of gallium and indium.

The present invention may be carried out as follows.

Preferably, the raw material solution includes gallium bromide or gallium iodide.

Preferably, the raw material solution includes indium bromide or indium iodide.

Preferably, the thin film includes a crystal which is oriented to a certain crystal axis.

Preferably, the thin film has a corundum structure.

Preferably, the thin film is α-phase $In_XAl_YGa_ZO_3$ where $0 \leq X \leq 2$, $0 \leq Y \leq 2$, $0 \leq Z \leq 2$, and $X+Y+Z=1.5$ to $2.5$.

Preferably, the sample on which films are to be formed and the thin film each have a corundum structure.

Preferably, the raw material solution includes an aluminum organometallic complex.

Preferably, the raw material fine particles include first raw material fine particles and second raw material fine particles formed from first and second raw material solutions, respectively, the first raw material solution including water and at least one of a gallium compound and an indium compound, the second raw material solution including an aluminum organometallic complex and water, and the first and second raw material fine particles are mixed before carried into the film forming chamber or mixed in the film forming chamber.

Preferably, the raw material solution includes a gallium compound, and the thin film is a crystal having β-gallia structure.

EMBODIMENTS

Figure 1:
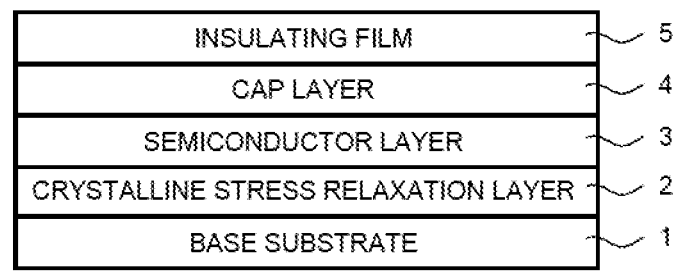
FIG. 1 shows an example configuration of a semiconductor device or crystal which can be manufactured using a method for manufacturing an oxide crystal thin film of one embodiment of the present invention.

A method for manufacturing an oxide crystal thin film of one embodiment of the present invention includes carrying raw material fine particles to a film forming chamber by means of a carrier gas, the raw material fine particles being formed from a raw material solution including water and at least one of a gallium compound and an indium compound, and forming an oxide crystal thin film on a sample on which films are to be formed, the sample being placed in the film forming chamber. At least one of the gallium compound and the indium compound is bromide or iodide.

This manufacturing method includes, for example, carrying raw material fine particles to a film forming chamber by means of a carrier gas, the raw material fine particles being formed from a raw material solution including water and at least one of a gallium compound and an indium compound, and causing the raw material fine particles to react in the film forming chamber to form an oxide crystal thin film on a sample on which films are to be formed, the sample being placed in the film forming chamber. At least one of the gallium compound and the indium compound is bromide or iodide.

Hereafter, the above steps will be described in detail.

1. Raw Material Solution

The raw material solution can be formed by dissolving at least one of a gallium compound and an indium compound in water. While there are a great many types of gallium compounds and indium compounds, bromide or iodide of these compounds is used in the present embodiment. The reason is that, as will be described in an Example later, use of bromide or iodide allows a high film forming speed and a reduction in the carbon impurity concentration of the formed thin films. Use of bromide or iodide also allows formation of a thin film having higher crystallinity than that when gallium chloride is used.

The concentration of the gallium compound or indium compound in the raw material solution is, for example, 0.001 to 10 mol/L, preferably 0.005 to 2 mol/L, but not limited thereto. More specifically, the concentration may be 0.001, 0.005, 0.01, 0.02, 0.03, 0.04, 0.05, 0.06, 0.07, 0.08, 0.09, 0.1, 0.2, 0.5, 1, 2, 5, or 10 mol/L, or a value in a range between two of the values presented.

The raw material solution may include only one or both of a gallium compound and an indium compound. These compounds may include only one or both of bromide and iodide. The raw material solution also may include a gallium compound or indium compound other than bromide and iodide or may include a metal compound other than a gallium compound and an indium compound. Note that in order to reduce the carbon impurity concentration, a metal compound included in the raw material solution is preferably free of carbon atoms. If aluminum atoms are included in the thin film, as in a case where Y>0 in corundum-structured α-phase $In_XAl_YGa_ZO_3$ where $0 \leq X \leq 2$, $0 \leq Y \leq 2$, $0 \leq Z \leq 2$, and $X+Y+Z=1.5$ to $2.5$, an organometallic complex, such as a beta-diketonate complex (e.g., acetylacetonate complex), or a compound other than a halide may be used as aluminum. In this case, carbon derived from the aluminum organometallic complex is included in the thin film. However, if aluminum is included only in the organometallic complex and if at least one of the gallium compound and the indium compound is bromide or iodide, the amount of carbon included in the raw material fine particles is reduced compared to when all the compounds are organometallic complexes. Thus, there is obtained the carbon impurity concentration reduction effect according to the present invention. Note that in the present description, an expression $In_XAl_YGa_ZO_3$ is used to represent the ratio between metal ions and oxygen ions. As is apparent also from the fact that X+Y+Z is not fixed to 2, $In_XAl_YGa_ZO_3$ includes a non-stoichiometric oxide, which includes a metal-deficient oxide and a metal-excess oxide, as well as an oxygen-deficient oxide and an oxygen-excess oxide.

Preferably, the solvent of the raw material solution is water (preferably, extra-pure water) and is free of an organic solvent. A dopant compound may be added to the raw material solution. Thus, the formed thin film can obtain conductivity and thus be used as a semiconductor layer. The reaction solution may include compounds other than the compounds described above and is preferably free of an organic compound. If carbon is used as a doping element, for example, a trace amount of organic acid (e.g., acetic acid) or the like may be added.

If a thin film (mixed crystal film) including two or more metal elements is formed, as in a case where at least two of X, Y, and Z are greater than 0 in β-phase $In_XAl_YGa_ZO_3$ where $0 \le X \le 2$, $0 \le Y \le 2$, $0 \le Z \le 2$, and $X+Y+Z=1.5$ to 2.5, two or more metal compounds may be dissolved in one raw material solution, or raw material solutions corresponding to respective metal compounds may be prepared and converted into fine particles separately.

For example, a mixed crystal of aluminum and gallium, aluminum and indium, or aluminum, gallium, and indium may be formed as follows: a first raw material solution including water and at least one of a gallium compound and an indium compound, and a second raw material solution including an aluminum organometallic complex and water are prepared; these raw material solutions are converted into first raw material fine particles and second raw material fine particles, respectively; and these raw material fine particles are mixed before carried into the film forming chamber or mixed in the film forming chamber. If an organometallic complex and bromide or iodide are mixed in one raw material solution, an anion exchange reaction occurs, forming gallium acetylacetonate, aluminum bromide, or aluminum iodide in the solution. This results in a reduction in the film forming speed, raw material efficiency, or crystallinity. On the other hand, by converting different solutions into fine particles separately and mixing the separate fine particles, the above exchange reaction can be minimized.

2. Conversion into Fine Particles

Typical methods for converting a raw material solution into raw material fine particles include a method of applying ultrasonic vibration to a raw material solution to obtain fine particles, but not limited thereto. Other methods may be used, for example, raw material fine particles may be formed by spraying a raw material solution.

3. Carrier Gas

The carrier gas is, for example, nitrogen but may be a gas, such as argon, oxygen, ozone, or air. The flow rate of the carrier gas is, for example, 0.1 to 50 L/min, preferably 0.5 to 10 L/min. but not limited thereto. More specifically, the flow rate may be 0.5, 1, 1.5, 2, 2.5, 3, 3.5, 4, 4.5, 5, 5.5, 6, 6.5, 7, 7.5, 8, 8.5, 9, 9.5, or 10 L/min, or a value in a range between any two of the values presented.

4. Film Forming Chamber, Sample on which Films are to be Formed, and Film Formation The raw material fine particles are carried into the film forming chamber by the carrier gas and make a reaction there, forming a thin film on a sample on which films are to be formed. The thin film formed on the sample is a thin film of an oxide crystal (preferably, a crystal oriented to a certain crystal axis).

The film forming chamber is space for forming thin films, and the configuration or material thereof is not particularly limited. In one example configuration of the film forming chamber, the carrier gas including the raw material fine particles is provided to one end of a quartz tube, and exhaust is discharged from the other end thereof, as shown in the Example. In this configuration, the sample may be placed in such a manner that the film forming surface thereof is horizontal or placed in such a manner that the film forming surface is inclined, for example, at 45 degrees toward the carrier gas source. The film forming chamber may be a film forming chamber using the fine channel method, in which a channel of several mm or less is used as a reaction area, a film forming chamber using the linear source method, in which a linear nozzle is disposed on a substrate, raw material fine particles (and a carrier gas) are perpendicularly sprayed on the substrate from the nozzle, and the nozzle is moved in a direction perpendicular to a linear outlet, or a film forming chamber using a combination of multiple methods, or a derivative of the aforementioned methods. The fine channel method allows formation of uniform thin films and improvements in the utilization efficiency of the raw material, whereas the linear source method allows continuous film formation on a future large-area substrate and by roll-to-roll. For example, by disposing a heater around the film forming chamber, the film forming chamber can heat the internal space to a predetermined temperature. The pressure in the film forming chamber may be increased or reduced.

The heating temperature of the film forming chamber during film formation may be any temperature as long as the temperature can cause the raw material solute (gallium compound, indium compound, or the like) included in the raw material solution to make a chemical reaction. For example, the heating temperature may be 300 to 1500° C., preferably 400 to 700° C., more preferably 450 to 550° C. This is because too low a heating temperature reduces the reaction speed of the raw material solute and thus the film forming speed; too high a heating temperature increases the etching speed of the formed thin film and thus reduces the film forming speed. More specifically, the heating temperature may be 300, 350, 400, 450, 500, 550, 600, 700, 800, 900, 1000, or 1500° C., or a temperature in a range between any two of the values presented. Note that when the film forming temperature is high, a β-phase tends to grow. For this reason, in order to obtain a single α-phase, a condition such as the concentration and composition of the solution, or the flow rate during film formation must be optimized for each temperature.

The sample may be of any type as long as thin films can be formed thereon. Examples of a preferred sample include a corundum-structured substrate, a β-phase gallium oxide substrate, and a corundum-structured thin film, but not limited thereto. Corundum-structured substrates which are currently readily available include a sapphire substrate. A corundum-structured substrate is preferable since a corundum-structured thin film (e.g., α-phase gallium oxide thin film, α-phase indium oxide thin film) can be easily formed thereon. The sample need not necessarily have a corundum structure. Preferred examples of such a sample include a substrate having a hexagonal crystal structure, typified by GaN or ZnO, a substrate having a cubic crystal structure, typified by YSZ, and a β-phase gallium oxide substrate. If gallium bromide or gallium iodide is used, a thin film of a β-gallia-structured crystal (e.g., β-phase gallium oxide) which does not have a corundum structure phase can be formed depending on the film forming condition. Thus, an α-phase crystal and a β-phase crystal can be formed separately. Further, by selecting an approximate substrate and film forming condition, it is possible to form a γ-phase gallium oxide thin film rather than a β-phase gallium oxide thin film.

FIG. 1 shows an example of a semiconductor device or crystal which can be manufactured by the method of the present embodiment. In the example of FIG. 1, a crystalline stress relaxation layer 2, a semiconductor layer 3, a cap layer 4, and an insulating film 5 are formed on a base substrate 1 in this order. The films may also be layered on the base substrate 1 sequentially from the insulating film. The crystalline stress relaxation layer 2 and the cap layer 4 may be omitted when not necessary. If the base substrate 1 and the semiconductor layer 3, or the semiconductor layer 3 and the insulating film 5 are formed from corundum-structured different materials, a corundum-structured structural phase transition prevention layer may be formed at least one of the positions between the semiconductor layer 3 and the insulating film 5, between the base substrate 1 and the semiconductor layer 3, between the crystalline stress relaxation layer 2 and the semiconductor layer 3, and between the cap layer 4 and the insulating film 5. The reason is that if the crystal growth temperature at which the crystalline stress relaxation layer 2, the semiconductor layer 3, the cap layer 4, and the insulating film 5 are formed is higher than the crystal structure transition temperature of the underlying layer, the corundum structure can be prevented from being changing to a different crystal structure by forming a structural phase transition prevention layer. On the other hand, if the formation temperature of the crystalline stress relaxation layer 2, the semiconductor layer 3, the cap layer 4, and/or the insulating film 5 is reduced to prevent the crystal structure of the film(s) from making a phase transition, the crystallinity thereof would be deteriorated. That is, it is difficult to prevent change of the crystal structure by reducing the film forming temperature. For this reason, the formation of a structural phase transition prevention layer is useful.

Examples of the base substrate 1 include a sapphire substrate and an α-phase gallium oxide substrate. The crystalline stress relaxation layer 2 may include one or more layers each having a corundum crystal structure, and may be formed of an α-phase $Al_XGa_YO_3$ film where $0 \leq X \leq 2$, $0 \leq Y \leq 2$, and $X+Y=1.5$ to 2.5. In the crystalline stress relaxation layer 2, the amount of Al is gradually reduced when the base substrate 1 is a sapphire substrate, and the amount of Al is gradually increased when the base substrate 1 is an α-phase $Ga_2O_3$ substrate. The semiconductor layer 3 may be an α-phase $In_XAl_YGa_ZO_3$ film where $0 \leq X \leq 2$, $0 \leq Y \leq 2$, $0 \leq Z \leq 2$, and $X+Y+Z=1.5$ to 2.5 and which has a corundum crystal structure. The cap layer or structural phase transition prevention layer may be an β-phase $Al_XGa_YO_3$ film where $0 \leq X \leq 2$, $0 \leq Y \leq 2$, and $X+Y=1.5$ to 2.5, which includes one or more layers, and where the amount of Al is gradually increased. The crystallinity stress relaxation layer and the cap layer can be expected to show an effect of reducing various types of dislocation, such as edge dislocation, screw dislocation, or basal plane dislocation, resulting from the difference in lattice constant between the sapphire substrate and the semiconductor layer and between the semiconductor layer and the insulating layer, respectively. For example, each of X, Y, and Z is 0, 0.1, 0.2, 0.3, 0.4, 0.5, 0.6, 0.7, 0.8, 0.9, 1, 1.1, 1.2, 1.3, 1.4, 1.5, 1.6, 1.7, 1.8, 1.9, or 2, or may be a value in a range between any two of the values presented. For example, X+Y or X+Y+Z is 1.5, 1.6, 1.7, 1.8, 1.9, 2, 2.1, 2.2, 2.3, 2.4, or 2.5, or may be a value in a range between any two of the values presented.

As seen above, by forming the layers including gallium or indium of the layers shown in FIG. 1 from bromide or iodide of a gallium compound or indium compound as shown in the present embodiment, it is possible to reduce the carbon impurity concentration and to achieve a high film forming speed.

After forming the films, the sample having the thin films formed thereon is extracted from the film forming chamber and subjected to device processes, such as ion implantation, etching, and photolithography. In this way, a semiconductor device is manufactured. Note that by changing the base substrate, it is possible to form a film having a crystal structure other than an α-phase crystal structure. Even when forming a film on a corundum-structured substrate, it is possible to form a film having a crystal structure other than an α-phase crystal structure, for example, by applying larger thermal energy than when forming an α-phase crystal film.

EXAMPLE

Hereafter, an Example of the present invention will be described.

1. Experiment 1

1-1. Mist CVD Apparatus

Figure 2:
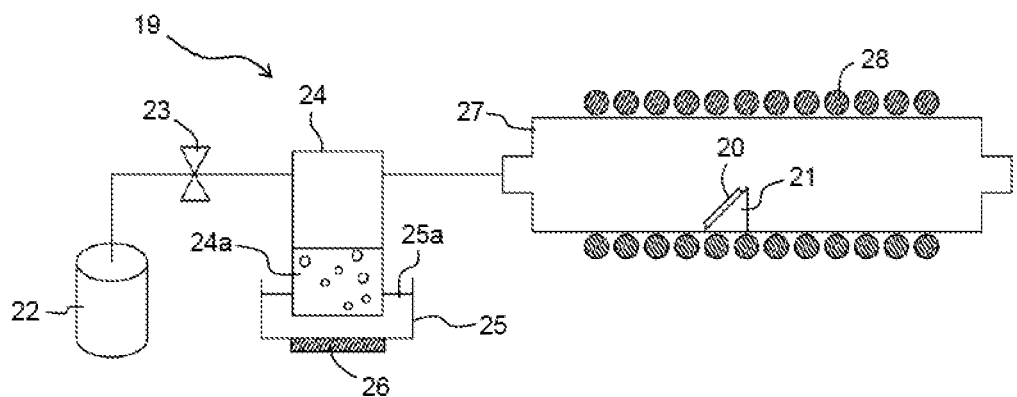
FIG. 2 is a configuration diagram of a mist CVD apparatus used in an Example of the present invention.

First, referring to FIG. 2, a mist CVD apparatus 19 used in this Example will be described. The mist CVD apparatus 19 includes a sample stage 21 for placing a sample 20 on which films are to be formed, such as a base substrate, a carrier gas source 22 for providing a carrier gas, a flow rate control valve 23 for controlling the flow rate of a carrier gas sent from the carrier gas source 22, a mist source 24 including a solution 24a, a container 25 containing water 25a, an ultrasonic transducer 26 attached to the bottom of the container 25, a film forming chamber 27 formed of a quartz tube having an inner diameter of 40 mm, and a heater 28 disposed around the film forming chamber 27. The sample stage 21 is formed of quartz, and the surface thereof for placing the sample 20 is inclined at 45 degrees from the horizontal plane. By forming both the film forming chamber 27 and the sample stage 21 from quartz, entry of apparatus-derived impurities into the films formed on the sample 20 is reduced.

1-2. Preparation of Raw Material Solution

By dissolving each raw material solute shown in Table 1 in extra-pure water, each raw material solution 24a having each concentration shown in Table 1 was prepared. Each raw material solution 24a was injected into the mist source 24. Note that acetylacetonate is abbreviated as "acac" in Table 1.

1-3. Preparation for Film Formation

Next, a c-plane sapphire substrate having a square shape having one side of 10 mm and having a thickness of 600 μm was placed as the sample 20 on the sample stage 21. Then the heater 28 was activated to raise the temperature in the film forming chamber 27 to a temperature shown in Table 1. Next, the flow rate control valve 23 was opened to send the carrier gas from the carrier gas source 22 into the film forming chamber 27. After the carrier gas sufficiently substituted for the atmosphere in the film forming chamber 27, the flow rate of the carrier gas was controlled to each value shown in Table 1. A nitrogen gas was used as the carrier gas.

1-4. Formation of Thin Films

Next, by vibrating the ultrasonic transducer 26 at 2.4 MHz so that the vibration is propagated to the raw material solution 24a through the water 25a, the raw material solution 24a was converted into raw material fine particles.

These raw material fine particles were injected into the film forming chamber 27 along with the carrier gas. Then the fine particles made a CVD reaction on the film forming surface of the sample 20 in the film forming chamber 27, forming a film on the sample 20.

1-5. Evaluation

The film forming speeds and the half-widths of the formed thin films measured in Experiments 1 to 17 are shown in Table 1. Each film forming speed was calculated by dividing the film thickness by the film forming time. The half-width of gallium oxide is a rocking curve half-width with respect to a (0006) diffraction of α-phase gallium oxide. The carbon impurity concentrations measured by secondary ion mass spectrometry (SIMS) are shown in the "IMPURITY" field of Table 1. The carbon impurity concentrations rated as ○ were about one-hundredth of those rated as X.

Examinations of respective Experiments are as follows.

When a raw material solution obtained by dissolving aluminum acetylacetonate in hydrochloric acid is used (No. 1), the carbon impurity concentration was significantly high.

When aluminum halide was used (Nos. 2 to 4), the film formation was unsuccessful.

When a raw material solution obtained by dissolving gallium acetylacetonate in hydrochloric acid was used (No. 5), the carbon impurity concentration was significantly high.

When a raw material solution obtained by dissolving gallium acetylacetonate in formic acid was used (No. 6), the film forming speed was significantly low.

When gallium sulfate or gallium nitrate was used (Nos. 7 and 8), the film formation failed.

When gallium chloride was used (Nos. 9 and 10), the film forming speed was significantly low compared to when gallium acetylacetonate was used. The half-width was large. The reason why a film was successfully formed, albeit at low speed, in Examples 9 and 10 although film formation failed in Non-Patent Document 1 is assumed to be related to the different flow rate of the carrier gas or the different concentration of the raw material solution.

When gallium bromide was used (No. 11), the film forming speed was extremely high, and the half-width was very small.

When gallium iodide having a relatively low concentration was used (No. 12), the film forming speed and the concentration were similar to those when gallium acetylacetonate was used, and the impurity concentration was low.

When gallium iodide having a relatively high concentration was used (No. 13), the film forming speed was very high.

When a raw material solution obtained by dissolving indium acetylacetonate in hydrochloric acid was used (No. 14), the carbon impurity concentration was very high.

When indium chloride was used (No. 15), the film formation was unsuccessful.

When indium bromide or indium iodide were used (Nos. 16 and 17), the film forming speed was very high. Particularly, when indium bromide was used (No. 16), the film forming speed was extremely high. Note that an experiment where indium acetylacetonate having the same concentration was used was also conducted. In this case, the film forming speed was too high and thus abnormal growth occurred, impairing crystallinity. For this reason, an experiment was conducted with a reduced raw material concentration.

When bromide or iodide of Cr, Fe, Ti, Si, V, and Mg was used (Nos. 18 to 23), no or almost no thin film growth reaction occurred.

From the above Experiments, it has been found that by forming a film from bromide or iodide of gallium or indium, it is possible to achieve both a reduction in the carbon impurity concentration and a high film forming speed. On the other hand, when bromide or iodide of Al, Cr, Fe, Ti, Si, V, and Mg was used, the film formation was unsuccessful. As seen above, the phenomenon in which use of bromide or iodide provides a good result is specific to gallium and indium, and use of bromide or iodide is difficult to apply uniformly to the other metal elements.

Compared to when an acetylacetonate complex was used as a raw material, the method of the present invention (bromide or iodide) reduced the impurity concentration, as well as increased the film forming speed, the raw material efficiency, and the crystallinity (X-ray half-width) under all the experiment conditions. For these reasons, the method of the present invention is also very useful in mass production processes.

TABLE 1

| Experiment No. | Raw Material Solutes Metal | Raw Material Solutes Anion | Raw Material Solution Concentration (mol/L) | Film Forming Conditions Carrier Gas Flow Rate (L/min) | Film Forming Conditions Temperature (C.) | Film Forming Conditions Time (min) | Film Thickness (nm) | film forming speed (nm/min) | Evaluation Results speed ratio (with respect to acac) | raw material efficiency (with respect to acac) | half-width (arcsec) | impurities |
|---|---|---|---|---|---|---|---|---|---|---|---|---|
| 1 | Al | acac/Cl | 0.15 | 3 | 500 | 30 | 120 | 4 | 1 | 1 | — | X |
| 2 | Al | Cl | 0.2 | 5 | 500 | 10 | ≤ measurement limit | — | — | — | — | — |
| 3 | Al | Br | 0.1 | 3 | 500 | 10 | ≤ measurement limit | — | — | — | — | — |
| 4 | Al | I | 0.1 | 3 | 500 | 10 | ≤ measurement limit | — | — | — | — | — |
| 5 | Ga | acac/Cl | 0.05 | 3 | 500 | 30 | 450 | 15.0 | 1 | 1 | 63.36 | X |
| 6 | Ga | acac/HCOO | 0.05 | 3 | 500 | 35 | 20 | 0.6 | 0.04 | 0.04 | — | X |
| 7 | Ga | SO4 | 0.1 | 3 | 500 | 60 | ≤ measurement limit | — | — | — | — | — |
| 8 | Ga | NO3 | 0.1 | 3 | 650 | 60 | ≤ measurement limit | — | — | — | — | — |
| 9 | Ga | Cl | 0.1 | 3 | 500 | 60 | 300 | 5.0 | 0.33 | 0.17 | 80 | ○ |
| 10 | | | 0.15 | 3 | 500 | 60 | 90 | 1.5 | 0.10 | 0.03 | — | ○ |
| 11 | Ga | Br | 0.1 | 3 | 500 | 16 | 700 | 43.8 | 2.92 | 1.46 | 36.01 | ○ |
| 12 | Ga | I | 0.05 | 5 | 500 | 10 | 160 | 16.0 | 1.07 | 1.07 | 60.12 | ○ |
| 13 | Ga | | 0.2 | 5 | 500 | 10 | 550 | 55.0 | 3.67 | 0.92 | — | ○ |
| 14 | In | acac/Cl | 0.05 | 1 | 550 | 60 | 100 | 1.7 | 1 | 1 | — | X |
| 15 | In | Cl | 0.01 | 5 | 500 | 10 | ≤ measurement limit | — | — | — | — | ○ |
| 16 | In | Br | 0.01 | 5 | 500 | 10 | 150 | 15.0 | 8.82 | 44.12 | — | ○ |
| 17 | In | I | 0.01 | 5 | 500 | 10 | 60 | 5.0 | 2.9 | 14.7 | — | ○ |
| 18 | Cr | Br | 0.1 | 3 | 500 | 10 | ≤ measurement limit | — | — | — | — | — |

TABLE 1-continued

| Experiment No. | Raw Material Solutes Metal | Raw Material Solutes Anion | Raw Material Solution Concentration (mol/L) | Film Forming Conditions Carrier Gas Flow Rate (L/min) | Film Forming Conditions Temperature (C.) | Film Forming Conditions Time (min) | Evaluation Results Film Thickness (nm) | Evaluation Results film forming speed (nm/min) | Evaluation Results speed ratio (with respect to acac) | Evaluation Results raw material efficiency (with respect to acac) | Evaluation Results half-width (arcsec) | Evaluation Results impurities |
|---|---|---|---|---|---|---|---|---|---|---|---|---|
| 19 | Fe | Cl | 0.1 | 3 | 500 | 30 | ≤ measurement limit | — | — | — | — | — |
| 20 | Ti | Cl | 0.1 | 3 | 500 | 60 | ≤ measurement limit | — | — | — | — | — |
| 21 | Si | Br | 0.1 | 3 | 500 | 20 | ≤ measurement limit | — | — | — | — | — |
| 22 | V | Br | 0.05 | 3 | 500 | 30 | ≤ measurement limit | — | — | — | — | — |
| 23 | Mg | Br | 0.1 | 3 | 500 | 60 | ≤ measurement limit | — | — | — | — | — |
| 24 | Ga | I | 0.05 | 5 | 580 | 120 | 2036 | 17 | 1.13 | — | 21 | ○ |
| 25 | Ga | I | 0.05 | 3 | 500 | 33 | 500 | 15.15 | 1.01 | 1.01 | 30.4 | ○ |

2. Experiment 2

Experiments were conducted under conditions shown in Tables 2 to 4. Nitrogen was used as a carrier gas, and the flow rate was set to 3 L/min.

An XRD diffraction apparatus for thin film was used to identify the crystal phase. In the tables, "α single" represents a condition where only a peak derived from α-phase $Ga_2O_3$ was observed; "β single" represents a condition where only a peak derived from β-phase $Ga_2O_3$ peak was observed; and "β mixture" represents a condition where peaks derived from both α-phase $Ga_2O_3$ and β-phase $Ga_2O_3$ were observed and no single phase was obtained.

As seen also from Tables 3 and 4, the methods using chloride or acetylacetonate were readily influenced by process variations, such as variations in the raw material concentration or film forming temperature, and tended to cause mixture of a β-phase and thus had difficulty in manufacturing an α-phase crystal stably. On the other hand, when bromide was used as described in the present invention, a single α-phase crystal phase was obtained over the wide temperature range or concentration range. Thus, yield can be improved.

As seen above, use of the present invention allows separate formation of an α-phase crystal and a β-phase crystal, as well as allows both a reduction of the carbon impurity concentration and a high film forming speed.

TABLE 2

| Bromide | | Film Forming Temperature | | | |
|---|---|---|---|---|---|
| | | 500° C. | 550° C. | 600° C. | 650° C. |
| Ga Concentration mol/L | 0.040 | | β single | β mixture | β mixture |
| | 0.050 | α single | | | |
| | 0.060 | | | | |
| | 0.075 | | α single | | |
| | 0.100 | α single | | | |
| | 0.125 | | | | |
| | 0.150 | α single | | α single | |
| | 0.300 | | | | |

TABLE 3

| Chloride | | Film Forming Temperature | | | |
|---|---|---|---|---|---|
| | | 500° C. | 550° C. | 600° C. | 650° C. |
| Ga Concentration mol/L | 0.040 | | | | |
| | 0.050 | Cannot form film (Non-Patent Document 1) | | | |
| | 0.060 | α single | | | |
| | 0.750 | | | | |
| | 0.100 | α single | | β mixture | |
| | 0.125 | | | | |
| | 0.150 | α single | β mixture | | |
| | 0.300 | β mixture | | | |

TABLE 4

| acac | | Film Forming Temperature | | | |
|---|---|---|---|---|---|
| | | 500° C. | 550° C. | 600° C. | 650° C. |
| Ga Concentration mol/L | 0.040 | | | | |
| | 0.050 | α single | β mixture (Non-Patent Document 1) | | |
| | 0.060 | | | | |
| | 0.750 | | | | |
| | 0.100 | Do not dissolve (partially precipitate) | | | |
| | 0.125 | | | | |
| | 0.150 | | | | |
| | 0.300 | | | | |

DESCRIPTION OF NUMERALS

1: base substrate
2: crystalline stress relaxation layer
3: semiconductor layer
4: cap layer
5: insulating film
19: mist CVD apparatus
20: sample on which films are to be formed
21: sample stage
22: carrier gas source
23: flow rate control valve
24: mist source
24a: raw material solution
25: mist source
25a: water
26: ultrasonic transducer 27: film forming chamber
28: heater

The invention claimed is:

1. A method for manufacturing an oxide crystal thin film, comprising
carrying raw material fine particles to a film forming chamber by means of a carrier gas, the raw material fine particles being formed from a raw material solution comprising water and gallium bromide, and forming an oxide crystal thin film at a temperature of 440 to 530° C. on a sample on which films are to be formed, the sample being placed in the film forming chamber, wherein the carrier gas has a flow rate of 1 to 10 L/min, and the concentration of the gallium bromide of the raw material solution is 0.10 to 0.20 mol/L.

2. The method of claim 1, wherein
the thin film comprises a crystal which is oriented to a certain crystal axis.

3. The method of claim 1, wherein
the thin film has a corundum structure.

4. The method of claim 1, wherein
the sample on which films are to be formed and the thin film each have a corundum structure.

5. The method of claim 1, wherein
the raw material fine particles in the film forming chamber further comprises fine particles formed from another raw material solution comprising an aluminum organometallic complex.

* * * * *